(12) United States Patent
Mori et al.

(10) Patent No.: US 6,961,802 B2
(45) Date of Patent: Nov. 1, 2005

(54) DATA INPUT/OUTPUT DEVICE, MEMORY SYSTEM, DATA INPUT/OUTPUT CIRCUIT, AND DATA INPUT/OUTPUT METHOD

(75) Inventors: Masaya Mori, Kawasaki (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 10/064,496

(22) Filed: Jul. 22, 2002

(65) Prior Publication Data
US 2003/0023788 A1    Jan. 30, 2003

(30) Foreign Application Priority Data
Jul. 24, 2001    (JP) .............................. 2001-223686

(51) Int. Cl.[7] ............................................. G06F 13/00
(52) U.S. Cl. .................. 710/310; 365/189.05; 711/168
(58) Field of Search ......................... 710/52, 310, 100; 365/189.01, 189.05; 326/30, 56, 86; 711/100, 711/167, 168

(56) References Cited

U.S. PATENT DOCUMENTS

| | | | | |
|---|---|---|---|---|
| 5,729,764 A | * | 3/1998 | Sato ............................ | 710/52 |
| 5,802,587 A | * | 9/1998 | Ishikawa et al. ............ | 711/155 |
| 5,872,471 A | * | 2/1999 | Ishibashi et al. ............. | 327/98 |
| RE36,621 E | * | 3/2000 | Nakaoka ................ | 365/189.01 |
| 6,127,849 A | * | 10/2000 | Walker ....................... | 326/86 |
| 6,690,191 B2 | * | 2/2004 | Wu et al. .................... | 326/30 |
| 6,807,609 B1 | * | 10/2004 | Lemmon et al. ............ | 711/150 |

* cited by examiner

Primary Examiner—Glenn A. Auve
(74) Attorney, Agent, or Firm—Jeanine S. Ray-Yarletts (57) ABSTRACT

When an output of data is switched from a memory to a memory controller, the memory controller takes in write data output from the memory, and outputs the write data taken in to a data bus. Subsequently, the memory controller outputs read data taken thereinto to the data bus, and then outputs write data of its own to the data bus.

15 Claims, 4 Drawing Sheets

DATA INPUT/OUTPUT DEVICE, MEMORY SYSTEM, DATA INPUT/OUTPUT CIRCUIT, AND DATA INPUT/OUTPUT METHOD

BACKGROUND OF INVENTION

The present invention relates to a method of using a buffer with a tri-state controller to output data successively from a plurality of different chips in a bus interface such as a CPU bus, and particularly to a proposal of a method of saving a bus clock cycle at a transition point, that is, at the time when a control for the bus moves from one chip to another.

When a bus interface is configured by a conventional buffer with a tri-state controller, a transient period or state must be created at the transition point of the bus, that is, at the time when other chips come to be controlled. When data is output from two chips in a transient period, it is an unavoidable possibility that a bus is simultaneously driven by the two chips, one having been driving the bus and the other assuming the drive of the bus. Particularly when the two chips output different signal levels including a high level (hereinafter referred to as "H") and a low level (hereinafter referred to as "L"), a through current flows between the two chips, and an input/output (hereinafter, referred to I/O) cell having a buffer is broken down. For example, when one chip outputs a write data signal and the other chip outputs a read data signal, such a situation may occur.

Figure 4:
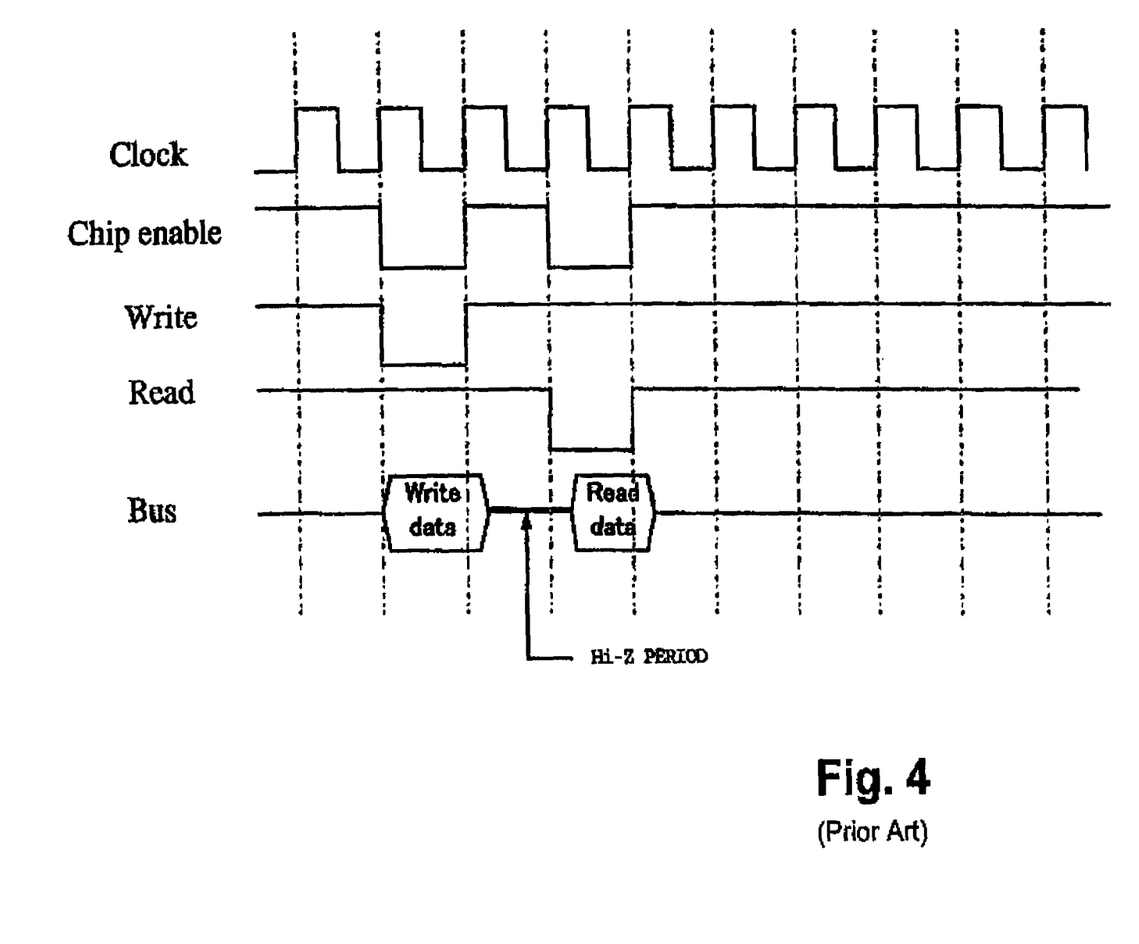
FIG. 4 is a timing chart showing an operation of a conventional memory system.

To make a transient period for preventing the breakdown of the I/O cell due to the through current, current practice is for main circuits synchronized with clocks to prepare a high impedance (hereinafter, referred to as Hi-Z) state for one clock, as shown in FIG. 4, when a bus is switched, for example from a data write operation to a data read operation. This is a large obstacle in circumstances where a bus including a CPU-memory bus is a main factor in determining the performance of a system.

The transient period for one clock can be solved by using an open drain buffer that can set a signal level to only two states of "L" and "H" which is created by pull-up. However, the open drain buffer has problems in that it consumes a large amount of current in the "L" state and it is difficult to realize a high speed operation of the open drain buffer. Accordingly, adoption of the open drain buffer requires circumspection at the present time.

Since it has been impossible to avoid waste equivalent to one clock cycle in switching the bus, there has been a limitation to improvement in the usability of the bus itself. Particularly, in the conventional case, in a bus transaction showing beats of the small number, the problem can be serious because of a sharp decrease in an efficiency of the bus. Specifically, when an access to data is made randomly, the bus efficiency is very low, and this is a large factor to lower CPU performance.

SUMMARY OF INVENTION

Accordingly, one purpose of the present invention is to reduce a wasted clock cycle in switching the bus typified by switching of an output.

As described above, when a potential of a data signal changes, for example, from "H" to "L" or from "L" to "H" in a transient period where switching from one chip for outputting the data signal to the other chip is made, a Hi-Z period must be introduced to avoid an electrical breakdown of an I/O cell in the case where the two chips fall into an outputting state simultaneously in the transient period. In a case of a circuit synchronized with clocks, the Hi-Z period for one or more clocks is prepared. When the data signal changes from "H" to "L" or from "L" to "H", the Hi-Z period is prepared by stopping driving of each chip mutually.

In the discussion which follows, consideration will be given to two chips (hereinafter, respectively referred to as a chip A and a chip B). While the chip A outputs a data signal (hereinafter, referred to as a signal a) of its own for a period equivalent to a half-clock, the chip B receives the signal a. Then, the chip B is in charge of an output as to the signal a equivalent to a half-clock. The signals are the same data signal, and in other words, show the same potential level. Even when outputs of the same potential level are performed from the two different chips A and B, the chips A and B do not cause electrical breakdown.

The chip B outputs a signal b that is a data signal of its own after passage of a half-clock from the outputting of the signal a. At this time, the change from "H" to "L" or from "L" to "H" occurs, but this change occurs merely in one chip B. Specifically, it is avoided that the two chips A and B output different potential data signals simultaneously.

Since, by controlling the outputs of the data signals as described above, it is possible to avoid that the plurality of chips output different potential data signals simultaneously, the Hi-Z period need not to be inserted. To be more concrete, occurrence of a situation that a bus efficiency is significantly decreased in iterating data read/write operations can be avoided, leading to a remarkable improvement of the bus efficiency.

BRIEF DESCRIPTION OF DRAWINGS

Some of the purposes of the invention having been stated, others will appear as the description proceeds, when taken in connection with the accompanying drawings, in which.

DETAILED DESCRIPTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

The present invention is based on the above-described knowledge, and the present invention is realized in a data input/output device which comprises: first and second data input/output circuits outputting data of their own and receiving data output from the other data input/output circuit; and a data bus transferring the data between the first and second data input/output circuits. In this data input/output device, when the outputting of the data from the first and second data input/output circuits is successively switched from the first data input/output circuit to the second data input/output circuit, the second data input/output circuit takes in the data from the data bus, the data being output from the first data input/output circuit to the data bus, and outputs the data taken thereinto to the data bus. Specifically, assuming that the data output from the first data input/output circuit be first-data, in the data input/output device of the present invention, the first data input/output circuit outputs the first data only for a period of a half-clock, and the second data input/output circuit can output the first data for a period of a half-clock subsequent to that half-clock. Accordingly, both of the first and second data input/output circuits never cause electrical breakdown.

In the data input/output device of the present invention, the second data input/output circuit outputs the data taken thereinto to the data bus, and then outputs data of its own to the data bus. Herein, when it is assumed that the data of the second data input/output circuit be second data, the second data input/output circuit outputs the second data after the outputting of the first data. Even when the first and second data have different potentials, these outputting operations are performed in one data input/output circuit. Therefore, a situation that a through current occurs does not happen.

As described above, the data input/output device of the present invention avoids a situation that switching of the circuit outputting the data and switching of the output data simultaneously occur. Then, such a situation can be avoided by a configuration that each of the first and second data input/output circuits comprises an output buffer for outputting data of its own, an input buffer for receiving data from the other data input/output circuit, and a relay line for transferring the data to the output buffer of its own, this data being output from the other data input/output circuit and being received by the input buffer of its own.

The data from the other data input/output circuit, which is transferred by the relay line, can be output to the data bus via the output buffer. Specifically, the output buffer possesses the two functions that the output buffer outputs not only the data of its own but also the data received from the other data input/output circuit. This implies that the data input/output device of the present invention can be realized by allowing a conventional data input/output circuit comprising an output buffer and an input buffer to have the relay line additionally.

As a concrete application example of the data input/output circuit, a memory system is mentioned which is configured by a memory controller and a memory. The present invention can be applied to this memory system. Accordingly, the present invention proposes an application to a memory system which comprises a memory controller for issuing a data read/write instruction, a memory for executing a data read/write operation based on the data read/write instruction from the memory controller, and a bus for connecting the memory controller and the memory.

According to this proposal, the memory controller comprises the following configuration. Specifically, the memory controller of the present invention comprises: a first output buffer for outputting write data to the bus, the write data being written into the memory; a first input buffer for receiving read data via the bus, the read data being read out from the memory; a first output line for transferring the write data to the first output buffer; a first input line for transferring the read data received by the first input buffer; a first multiplexer arranged on the first output line; and a first relay line connecting the first input line and the first multiplexer.

Furthermore, the memory comprises: a memory cell for storing read/write data; a second output buffer for outputting the read data to the bus, the read data being read out from the memory cell in response to the read instruction of the memory controller; a second input buffer for receiving the write data output from the first output buffer of the memory controller; a second output line for transferring the read data to the second output buffer, the read data being transferred from the memory cell; a second input line for transferring the write data received by the second input buffer to the memory cell; a second multiplexer arranged on the second output line; and a second relay line for connecting the second input line and the second multiplexer.

In the above-described memory system, when the memory controller issues the read instruction to the memory, the second multiplexer of the memory selects the second output line. Then, the memory reads out the read data from the memory cell. This read data is output to the bus via the second output line and the second output buffer.

On the other hand, the first input buffer of the memory controller receives the read data via the bus. After a minute time, when the first multiplexer selects the first relay line, the memory controller outputs the read data to the bus via the first input line, the first relay line, the first output line and the first output buffer.

Specifically, the memory system of the present invention can output one read data to the bus from the two chips respectively incorporated in the memory and the memory controller for, for example, one clock period. At this time, though switching of the chips is performed, the data output respectively from the two chips is the same read data. Therefore, a through current never occurs between the memory controller and the memory.

The memory controller outputs the read data to the bus. Thereafter, the memory controller takes in the read data from the bus, and transfers the read data to an internal circuit that requires the read data. Thus, the read operation is completed.

The read operation for the data has been described above. A write operation for the data is as follows.

When the memory controller issues a write instruction to the memory, the memory controller selects the first output line by the first multiplexer thereof, and outputs the write data, which is transferred from the outside, to the bus via the first output line and the first output buffer.

The memory receives the write data via the bus by the second input buffer thereof. After passage of a minute time from the receipt of the write data, the second multiplexer of the memory selects the second relay line. Upon the selection of the second relay line, the memory outputs the write data to the bus via the second input line, the second relay line, the second output line and the second output buffer.

Specifically, the memory system of the present invention can output one write data to the bus from the two chips respectively incorporated in the memory and the memory controller for, for example, one clock period. At this time, though switching of the chips is performed, the data output respectively from the two chips is the same write data. Therefore, a through current never occurs between the memory controller and the memory.

The memory outputs the write data to the bus. Thereafter, the memory takes in the write data from the bus, and stores the write data in the memory cell. Thus, the write operation is completed.

In the above descriptions, the read operation and the write operation are described separately. The switching from the read operation to the write operation or from the write operation to the read operation is performed as follows.

When the switching from the read operation to the write operation is made, the outputting of the data and the switching of the chips are executed in the order of the outputting of the read data by the memory, the outputting of this read data by the memory controller, the outputting of the write data by the memory controller and the outputting of this write data by the memory.

When the switching from the write operation to the read operation is made, the outputting of the data and the switching of the chips are executed in the order of the outputting of the write data by the memory controller, the outputting of this write data by the memory, the outputting of the read data by the memory and the outputting of this read data by the memory controller. Note that the object of the outputting herein is the bus.

The switching between the write and read operations is executed as described above. In the memory system of the present invention, it is possible to avoid a situation that the switching between the memory controller and the memory and the switching between the read data and the write data simultaneously occur. Accordingly, occurrence of the through current can be prevented without the preparation of the Hi-Z period.

As described above, in the present invention, the individual data input/output circuits such as the memory controller and the memory have novel configurations that have not existed until now, and the present invention is the fruits of the above-described configuration coupled with the special controls.

The data input/output circuit of the present invention comprises: an input/output cell in which a first buffer for outputting output data to a data bus and a second buffer for receiving input data transferred from the data bus are connected to the data bus; data holding means for holding the output data and the input data; an output line for transferring the output data held in the data holding means to the first buffer; and an input line for transferring the input data received by the second buffer to the data holding means.

In addition to the above configurations, the data input/output circuit of the present invention further comprises: a relay line for transferring the input data to the output buffer via the second buffer; and line selection means for selectively making any of data transfers of the output line and the relay line valid. The comprisal of the relay line and the line selection means enables the input data received by the second buffer to be output to the data bus via the relay line and the first buffer.

The data input/output circuit of the present invention further comprises control signal generating means for outputting an output control signal to an input/output cell, the output control signal being for controlling whether the data can be output from the input/output cell. The control signal generating means can output a selection signal to the line selection means, the selection signal being for controlling selection in the line selection means. During this outputting of the selection signal, the control signal generating means can output the input data received by the second buffer to the data bus via the relay line and the first buffer.

The control signal generating means can output the output control signal to the input/output cell, the output control signal enabling the data to be output from the input/output cell, and can output the selection signal, which selects the relay line, to the line selection means after passage of a predetermined time from the outputting of the output control signal.

A new data input/output method realized by the above-described data input/output device, in which first and second data input/output circuits respectively receive data output from the other data input/output circuit via a bus and respectively output data of their own to the bus, the method comprising the steps of: outputting a first signal to a bus by the first data input/output circuit, the first signal being data of the first data input/output circuit's own; taking in the first signal from the bus by the second data input/output circuit; and outputting the first signal to the bus by the second data input/output circuit. Subsequently, the method further comprises the steps of: outputting a second signal to the bus by the second data input/output circuit, the second signal being data of the second data input/output circuit's own; taking in the second signal from the bus by the first data input/output circuit; and outputting the second signal to the bus by the first data input/output circuit.

Figure 1:
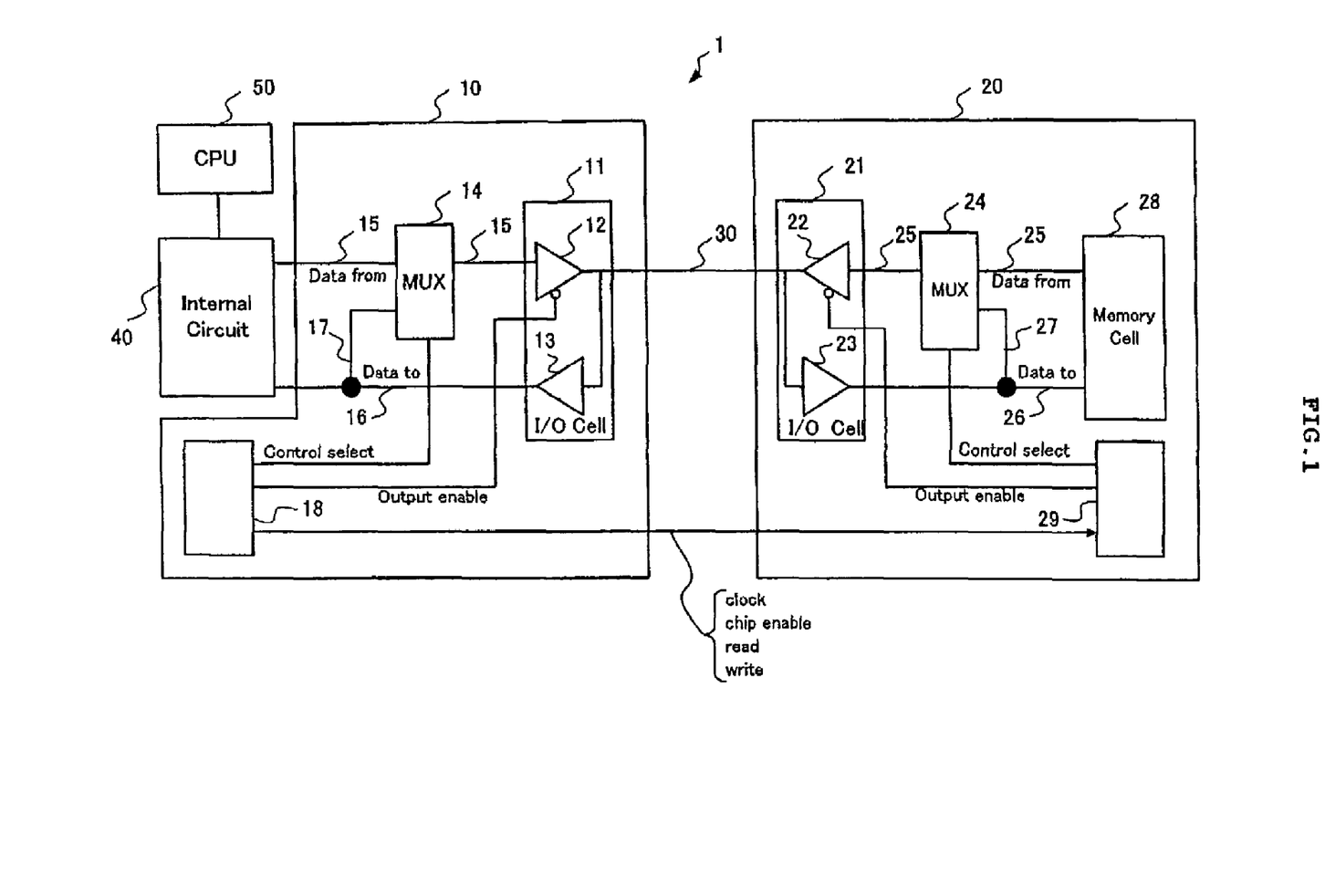
FIG. 1 is a block diagram showing a configuration of a memory system according to an embodiment of the present invention.

Referring now more particularly to the accompanying drawings, FIG. 1 is a block diagram showing an example in which the present invention is applied to a memory system 1 comprising a memory controller 10 and a memory 20.

In FIG. 1, the memory controller 10 and the memory 20 are connected by a data bus 30. A CPU (central processing unit) 50 is connected to the memory controller 10 via an internal circuit 40.

The memory controller 10 is regarded as a master in relation to the memory 20.

The memory controller 10 comprises an input/output (I/O) cell 11 and a multiplexer (MUX) 14.

The I/O cell 11 comprises an output buffer 12 and an input buffer 13. The output buffer 12 is a buffer for outputting data to the memory 20 via the data bus 30, and the input buffer 13 is a buffer for receiving the data transferred from the memory 20 via the data bus 30. An output enable (OE) signal is supplied to the output buffer 12. In this embodiment, when the OE signal is "L", the output buffer 12 falls into a state where the output buffer 12 can output the data therefrom. The OE signal is generated by a control signal generating means 18.

The output buffer 12 is connected to the internal circuit 40 by an output line 15 on which the MUX 14 is arranged. Data that is stored in the internal circuit 40 and output therefrom is output to the data bus 30 from the output buffer 12 via the output line 15. This data is write data.

The input buffer 13 is connected to the internal circuit 40 via an input line 16. Data supplied from the memory 20 is transferred to the internal circuit 40 via the input buffer 13 and the input line 16.

A relay line 17 is arranged between the input line 16 and the MUX 14. When the MUX 14 selects the relay line 17, the data supplied to the input buffer 13 can be output to the data bus 30 via the input line 16, the relay line 17, the output line 15 and the output buffer 12.

The MUX 14 selects any of the output line 15 and the relay line 17 by a control select (CS) signal. To be concrete, when the CS signal is "L", the MUX 14 selects the data from the output line 15. When the CS signal is "H", the MUX 14 selects the data from he relay line 17. Also the CS signal is generated by the control signal generating means 18.

The control signal generating means 18 generates a clock signal, a chip enable signal, a read instruction signal and a write instruction signal, and sends out these signals to a control signal generating means 29 in the memory 20. The chip enable signal is a signal indicating which operation of read and write operations is to be performed. The OE signal in the controller 10 and an OE signal in the memory 20 are generated by a combination of the chip enable signal, the write signal and the read signal or by a combination of the chip enable signal, the write signal, the read signal and the clock signal.

The memory 20 comprises an input/output (I/O) cell 21, a multiplexer (MUX) 24 and a memory cell 28.

The I/O cell 21 comprises an output buffer 22 and an input buffer 23. The output buffer 22 is a buffer for outputting data to the memory controller 10 via the data bus 30. The input buffer 23 is a buffer for receiving data transferred from the memory controller 10 via the data bus 30. An output enable (hereinafter, referred to as OE) signal is supplied to the output buffer 22. Similarly to the memory controller 10, the output buffer 22 falls into a state where the output buffer 22 can output the data, when the OE signal is "L". The OE signal is generated by a combination of the chip enable signal, the write signal and the read signal or by a combination of the chip enable signal, the write signal, the read signal and the clock signal.

The output buffer 22 is connected to the memory cell 28 by an output line 25 on which the MUX 24 is arranged. Data output from the memory cell 28 is output to the data bus 30 from the output buffer 22 via the output line 25. This data is read data.

The input buffer 23 is connected to the memory cell 28 via an input line 26. Write data supplied to the memory 20 from the memory controller 10 is transferred to the memory cell 28 via the input buffer 23 and the input line 26.

A relay line 27 is arranged between the input line 26 and the MUX 24. When the MUX selects the relay line 27, the data supplied to the input buffer 23 can be output to the data bus 30 via the input line 26, the relay line 27, the output line 25 and the output buffer 22.

The MUX 24 selects any of the output line 25 and the relay line 27 by a control select (hereinafter, referred to as CS) signal. To be concrete, when the CS signal is "L", the MUX 24 selects data from the output line 25. When the CS signal is "H", the MUX 24 selects data from the relay line 27. The CS signal is generated by the control signal generating means 29.

The memory cell 28 stores the write data transferred thereto. This data becomes the read data when a read instruction is issued.

Figure 2:
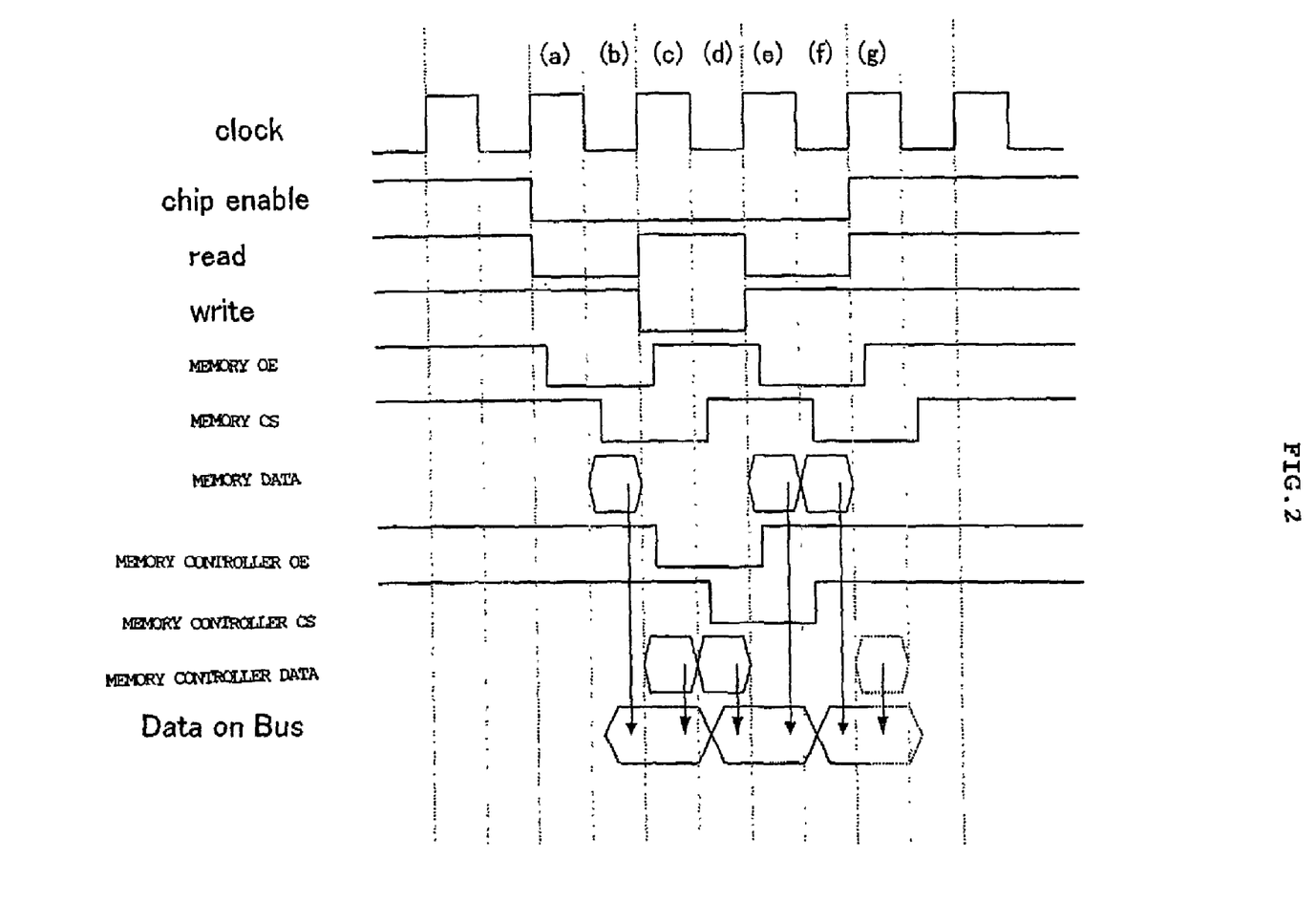
FIG. 2 is a timing chart showing an operation of the memory system according to the embodiment of the present invention.

FIG. 2 is a timing chart showing operations of the I/O cell 11 and the MUX 14 in the memory controller 10 and operations of the I/O cell 21 and the MUX 24 in the memory 20 when a read operation of the memory controller 10 to the memory 20 is switched to a write operation and then to the read operation. The operations in this embodiment will be described with reference to this timing chart below. Note that the following symbols (a) to (g) represent operations during the periods represented by the symbols (a) to (g) of FIG. 2.

(a) The read instruction is issued from the memory controller 10 to the memory 20. In this embodiment, the control signal generating means 29 of the memory 20 generates the OE signal of "L" by setting the chip enable signal and the read instruction signal to "L", and supplies the OE signal to the output buffer 22 to allow the I/O cell 21 to fall into a state where the I/O cell 21 can output the data (hereinafter, referred to as an output-capable state)T (b) The memory 20 changes the CS signal supplied to the MUX 24 from "H" to "L" after passage of a half-clock after the I/O cell 21 falls into the output-capable state. The MUX 24 selects the output line 25. Accordingly, the data stored in the memory cell 28 is read out. This read data is output onto the data bus 30 via the output line 25 and the output buffer 22. This read data is data for the memory 20 itself.

At this time, both of the OE signal and the CS signal of the I/O cell 11 of the memory controller 10 are "H". Accordingly, the input buffer 13 is in a state where the input buffer 13 always takes in data on the data bus 30. The MUX 14 selects the relay line 17. As a result, the data is decided during the period of (b) for the relay line 17.

(c) The instruction from the memory controller 10 is switched from the read instruction to a write instruction. In the memory 20, the OE signal becomes "H", and the output buffer 22 falls into a state where the output buffer 22 is incapable of outputting the data (hereinafter, referred to as an output-incapable state). Thus, the outputting of the read data from the memory 20 is stopped.

On the other hand, the OE signal of the memory controller 10 becomes "L", and the output buffer 12 falls into the output-capable state. At this time, since the CS signal of the memory controller 10 is "H", the MUX 14 selects the relay line 17. Accordingly, the read data decided during the period of (b) is output to the data bus 30 via the output line 15 and the output buffer 12.

This read data is the same as the read data output from the memory 20 to the data bus 30 during the period of (b). Specifically, this read data has a potential level equal to that of the read data output from the memory 20 to the data bus 30 during the period of (b). Accordingly, even if the memory controller 10 and the memory 20 show different operation speeds from each other, a through current is never generated. In addition, even when the output of the memory 20 falls into an inactive state and into a high impedance (Hi-Z) state for a moment due to the difference in the operation speeds between the memory controller 10 and the memory 20, a transition time on the millisecond scale is required for a period of time from "H" or "L" to the Hi-Z state. Accordingly, the transition time is very long compared to a time difference caused by the difference of the operation speeds between the memory controller 10 and the memory 20. Therefore, an intermediate potential (Hi-Z) never appears on the data bus 30.

The read data output for every half-clock from the memory 20 and the memory controller 10 appears on the data bus 30 during one clock composed of the periods (b) and (c).

The memory controller 10 takes in the read data at the trailing edge of the clock during the period of (c), and thus one cycle for the reading-out is completed. The read data taken into the memory controller 10 is supplied to the internal circuit 40 via the input line 16.

(d) When the CS signal of the memory controller 10 changes to "L", the MUX 14 selects the output line 15. Thus, the write data from the internal circuit 40 is output to the data bus 30 via the output line 15 and the output buffer 12. This write data is data for the memory controller 10 itself.

At this time, both of the OE signal and the CS signal of the I/O cell 21 of the memory 21 are "H". Accordingly, the input buffer 23 is in a state where the input buffer 23 always takes in the data on the data bus 30. Moreover, the MUX 24 selects the relay line 27. As a result, the data is decided during the period of (d) for the relay line 27.

(e) The instruction from the memory controller 10 is switched to the read instruction.

In the memory controller 10, the OE signal becomes "H", and the output buffer 12 falls into an output-incapable state. The outputting of the write data from the memory controller 10 is stopped.

On the other hand, the OE signal of the memory 20 becomes "L", and the output buffer 22 falls into an output-capable state. At this time, since the CS signal of the memory 20 is "H", the MUX 24 selects the relay line 27. Accordingly, the write data decided during the period of (d) is output to the data bus 30 via the output line 25 and the output buffer 22.

This write data is the same as the write data output from the memory controller 10 during the period of (d). Specifically, this write data has a potential level equal to that of the write data output from the memory controller 10 to the data bus 30 during the period of (d). Accordingly, even if the memory controller 10 and the memory 20 show different operation speeds from each other, a through current is never generated. In addition, even when the output of the memory 20 falls into the inactive state and in the high impedance (Hi-Z) state for a moment due to the difference in the operation speeds between the memory controller 10 and the memory 20, a transition time on the millisecond scale is required for a period of time from "H" or "L" to the Hi-Z state. Accordingly, the transition time is very long compared to a time difference caused by the difference of the operation speeds between the memory controller 10 and the memory 20. Therefore, the intermediate potential (Hi-Z) never appears on the data bus 30.

(f) After passage of a half-clock after the I/O cell 21 falls into the output-incapable state, the CS signal for the MUX 24 is changed from "H" to "L". Subsequently, similar operations to those of the period of (b) are performed. Specifically, data read out from the memory cell 28 is output onto the data bus 30. In addition, for the relay line 17 connected to the MUX 14 of the memory controller 10, the data is decided during the period of (f).

During the period of (g) in FIG. 2, similar operations to those of the period of (c) are performed.

As described above, the memory system 1 according to this embodiment outputs the read data read out from the memory cell 28 to the data bus 30 via the output line 25 and the output buffer 22 during the read operation of the data. On the other hand, the memory controller 10 receives this read data on the data bus 30 by the output buffer 12 via the data bus 30. Thereafter, the memory controller 10 outputs this read data to the data bus 30 via the input line 16, the relay line 17, the output line 15 and the output buffer 12.

During the write operation of the data, the write data transferred from the internal circuit 40 is output to the data bus 30 via the output line 15 and the output buffer 12. On the other hand, the memory 20 receives this write data by the input buffer 23 via the data bus 30. Thereafter, the memory 20 outputs this write data to the data bus 30 via the input line 26, the relay line 27, the output line 25 and the output buffer 22.

Specifically, the memory system 1 can output one read data to the data bus 30 from the two chips that are the memory 20 and the memory controller 10 during the one clock period. At this time, switching of the chips is performed. The two data output from the memory controller 10 and the memory 20 respectively are the identical read data. Therefore, the through current is never generated between the memory controller 10 and the memory 20.

Figure 3:
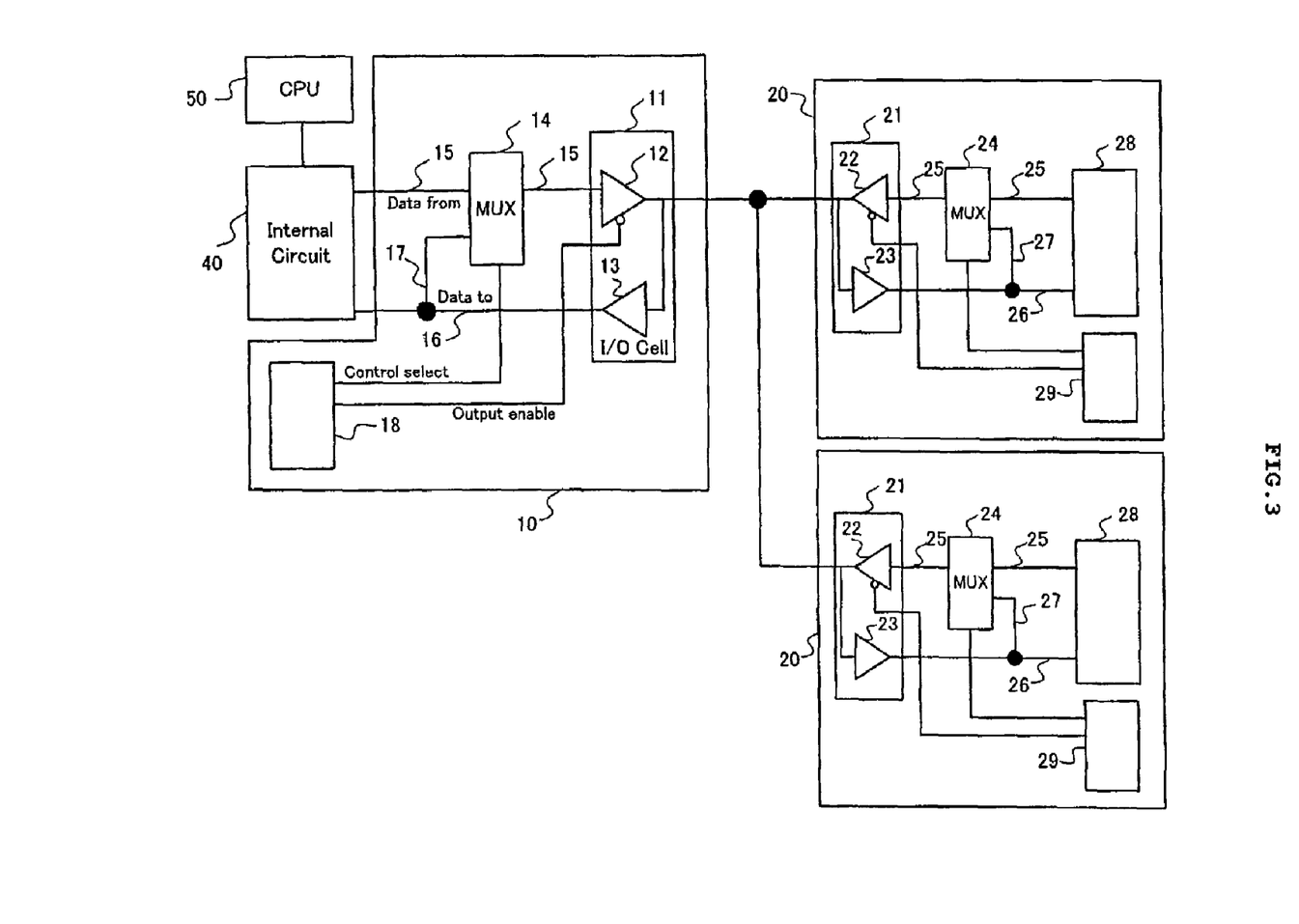
FIG. 3 is a block diagram showing another configuration of the memory system according to the embodiment of the present invention.

The case where the memory system 1 has one memory 20 was described in the above. For example, the present invention can be applied to a memory system comprising two or more memories 20 as shown in FIG. 3. In this case, it is natural that the data input/output method of the present invention can be applied to operations of the memories 20. The above description is merely one embodiment of the present invention, and the present invention is not limited to this in deciding the scope of the present invention.

As described above, according to the present invention, simultaneous occurrences of the switching of the circuits outputting the data and the switching of the output data are avoided. Accordingly, it is unnecessary to prepare a Hi-Z period unlike the conventional memory system, and hence a bus efficiency can be enhanced.

In the drawings and specifications there has been set forth preferred embodiments of the invention and, although specific terms are used, the description thus given uses terminology in a generic and descriptive sense only and not for purposes of limitation.

What is claimed is:

1. Apparatus comprising:
    first and second data input/output circuits, each of said circuits receiving data output from the other and releasing data stored therein; and
    a data bus transferring data between said first and second data input/output circuits,
    wherein, upon data output being successively switched from said first data input/output circuit to said second data input/output circuit, said second data input/output circuit takes in data output from said first data input/output circuit and releases said data taken thereinto to said data bus.

2. Apparatus according to claim 1, wherein after said second data input/output circuit outputs said data taken thereinto to said data bus, said second data input/output circuit outputs data thereof to said data bus.

3. Apparatus according to claim 1, wherein each of said first and second data input/output circuits includes;
    an output buffer for outputting data thereof;
    an input buffer for receiving data from the other data input/output circuit; and
    a relay line joining said buffers for transferring said data to said output buffer, said data being output from the other data input/output circuit and being received by said input buffer.

4. Apparatus according to claim 3, wherein said output buffer outputs said data to said data bus, said data being output from the other data input/output circuit and being transferred from said relay line.

5. Apparatus comprising:
    a memory controller for issuing a data read/write instruction;
    a memory for executing a data read/write operation in response to the data read/write instruction from said memory controller; and
    a bus for connecting said memory controller and said memory,
    wherein said memory controller includes:
    a first output buffer for outputting write data to said bus, said write data being written to said memory;
    a first input buffer for receiving read data via said bus, said read data being read out from said memory;
    a first output line for transferring said write data to said first output buffer;
    a first input line for transferring said read data received by said first input buffer:
    a first multiplexer arranged on said first output line; and
    a first relay line connecting said first input line and said first multiplexer, and further wherein
    said memory includes:
    a memory cell for storing read/write data;
    a second output buffer for outputting said read data to said bus, said read data being read out from said memory cell in response to a read instruction of said memory controller;

a second input buffer for receiving said write data output from said first output buffer of said memory controller;

a second output line for transferring said read data to said second output buffer, said read data being transferred from said memory cell;

a second input line for transferring said write data received by said second input buffer to said memory cell;

a second multiplexer arranged on said second output line; and a second relay line for connecting said second input line and said second multiplexer.

6. Apparatus according to claim 5, wherein when said memory controller issues the read instruction to said memory, said memory selects said second output line by said second multiplexer thereof and reads out said read data from said memory cell to output said read data to said bus via said second output line and said second output buffer, and said memory controller receives said read data via said bus by said first input buffer thereof, and selects said first relay line by said first multiplexer thereof after passage of a predetermined time to output said read data to said bus via said first input line, said first relay line, said first output line and said first output buffer.

7. Apparatus according to claim 6, wherein said memory controller outputs said read data to said bus, and then takes in said read data from said bus.

8. Apparatus according to claim 5, wherein, when said memory controller issues a write instruction to said memory, said memory controller selects said first output line by said first multiplexer thereof and outputs said write data to said bus via said first output line and said first output buffer, and said memory receives said write data via said bus by said second input buffer thereof, and selects said second relay line after passage of a predetermined time by said second multiplexer thereof to output said write data to said bus via said second input line, said second relay line, said second output line and said second output buffer.

9. Apparatus according to claim 8, wherein said memory outputs said write data to said bus, and then takes in said write data from said bus.

10. Apparatus according to claim 5, wherein, when said memory controller issues the data read/write instruction to said memory successively, said memory selects said second output line by said second multiplexer thereof, and reads out said read data from said memory cell to output said read data to said bus via said second output line and said second output buffer, said memory controller receives said read data via said bus by said first input buffer thereof, and selects said first relay line after passage of a predetermined time by said first multiplexer thereof to output said read data to said bus via said first input line, said first relay line, said first output line and said first output buffer, said memory controller selects said first output line by said first multiplexer thereof, and outputs said write data to said bus via said first output line and said first output buffer, and said memory receives said write data via said bus by said second input buffer thereof, and selects said second relay line after passage of a predetermined time by said second multiplexer thereof to output said write data to said bus via said second input line, said second relay line, said second output line and said second output buffer.

11. Apparatus comprising:

an input/output cell in which a first buffer for outputting output data to a data bus and a second buffer for receiving input data transferred from said data bus are connected to said data bus;

a data holding circuit for holding said output data and said input data;

an output line for transferring said output data held in said data holding circuit to said first buffer;

an input line for transferring said input data received by said second buffer to said data holding circuit;

a relay line for transferring said input data to said first buffer via said second buffer; and a line selection circuit for selectively making any of data transfers of said output line and said relay line valid.

12. Apparatus according to claim 11, further comprising:

a control signal generating circuit for outputting an output control signal to said input/output cell, the output control signal being for controlling whether said data can be output from said input/output cell.

13. Apparatus according to claim 12, wherein said control signal generating circuit outputs a selection signal to said line selection circuit, said selection signal being for controlling selection in said line selection circuit.

14. Apparatus according to claim 13, wherein, while said control signal generating circuit is outputting said selection signal to said line selection circuit, said input data received by said second buffer is output to said data bus via said relay line and said first buffer.

15. Apparatus according to claim 14, wherein said control signal generating circuit outputs an output control signal to said input/output cell, said output control signal enabling said input/output cell to output the data: and said control signal generating circuit outputs said selection signal to said line selection circuit after passage of a predetermined time from the outputting of said output control signal, said selection signal being for selecting said relay line.

* * * * *